US008828834B2

(12) United States Patent  
Pandey et al.

(10) Patent No.: US 8,828,834 B2
(45) Date of Patent: Sep. 9, 2014

(54) METHODS OF TAILORING WORK FUNCTION OF SEMICONDUCTOR DEVICES WITH HIGH-K/METAL LAYER GATE STRUCTURES BY PERFORMING A FLUORINE IMPLANT PROCESS

(75) Inventors: Shesh Mani Pandey, Dresden (DE); Shiang Yang Ong, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 95 days.

(21) Appl. No.: 13/494,686

(22) Filed: Jun. 12, 2012

(65) Prior Publication Data

US 2013/0330900 A1    Dec. 12, 2013

(51) Int. Cl.
*H01L 21/336* (2006.01)

(52) U.S. Cl.
USPC ............................ 438/308; 438/301; 438/306

(58) Field of Classification Search
CPC .............. H01L 29/517; H01L 21/2822; H01L 21/28185; H01L 21/28088; H01L 21/28176; H01L 29/4966; H01J 37/32412
USPC .................................. 438/301, 306–308, 197
See application file for complete search history.

(56) References Cited

U.S. PATENT DOCUMENTS

| | | | |
|---|---|---|---|
| 4,748,131 A | 5/1988 | Zietlow | |
| 5,605,848 A | 2/1997 | Ngaoaram | |
| 5,683,946 A | 11/1997 | Lu et al. | |
| 5,712,208 A | 1/1998 | Tseng et al. | |
| 5,714,788 A | 2/1998 | Ngaoaram | |
| 5,726,087 A | 3/1998 | Tseng et al. | |
| 5,767,558 A | 6/1998 | Lo et al. | |
| 5,959,333 A | 9/1999 | Gardner et al. | |
| 6,093,589 A | 7/2000 | Lo et al. | |
| 6,093,607 A | 7/2000 | Hsieh et al. | |
| 6,093,659 A | 7/2000 | Grider et al. | |
| 6,432,786 B2 | 8/2002 | Chen et al. | |
| 6,541,321 B1 | 4/2003 | Buller et al. | |
| 6,593,196 B2 | 7/2003 | Akram et al. | |
| 6,596,570 B2 | 7/2003 | Furukawa | |
| 6,667,509 B1 | 12/2003 | Hsieh et al. | |
| 6,720,213 B1 | 4/2004 | Gambino et al. | |
| 6,825,133 B2 | 11/2004 | Yu et al. | |
| 7,105,411 B1 | 9/2006 | Akram et al. | |
| 7,227,230 B2 | 6/2007 | Gambino et al. | |
| 7,514,310 B2 | 4/2009 | Kim et al. | |

(Continued)

OTHER PUBLICATIONS

Office Action dated Jan. 16, 2014 for U.S. Appl. No. 13/785,557, 15 pages.

(Continued)

*Primary Examiner* — Charles Garber
*Assistant Examiner* — Brigitte Paterson
(74) *Attorney, Agent, or Firm* — Amerson Law Firm, PLLC

(57) ABSTRACT

One illustrative method disclosed herein includes forming a plurality of layers of material above a semiconducting substrate, wherein the plurality of layers of material will comprise a gate structure for a transistor, performing a fluorine ion implantation process to implant fluorine ions into at least one of the plurality of layers of material, performing at least one ion implantation process to implant one of a P-type dopant material or an N-type dopant material into the substrate to form source/drain regions for the transistor, and performing an anneal process after the fluorine ion implantation process and the at least one ion implantation process have been performed.

16 Claims, 13 Drawing Sheets

(56) References Cited

U.S. PATENT DOCUMENTS

| | | | |
|---|---|---|---|
| 7,867,839 | B2 | 1/2011 | Chen et al. |
| 7,893,482 | B2 | 2/2011 | Kim et al. |
| 8,076,228 | B2 | 12/2011 | Berthold et al. |
| 8,232,605 | B2 | 7/2012 | Lin et al. |
| 2003/0124823 | A1 | 7/2003 | Jain et al. |
| 2004/0102013 | A1 | 5/2004 | Hwang et al. |
| 2004/0171201 | A1 | 9/2004 | Gambino et al. |
| 2005/0202659 | A1* | 9/2005 | Li et al. ............ 438/533 |
| 2006/0068575 | A1 | 3/2006 | Gluschenkov et al. |
| 2006/0273412 | A1* | 12/2006 | Tamura et al. ............ 257/410 |
| 2008/0057654 | A1 | 3/2008 | Chen et al. |
| 2008/0157215 | A1 | 7/2008 | Miyashita |
| 2009/0090975 | A1 | 4/2009 | Ong et al. |
| 2009/0197381 | A1 | 8/2009 | Lenski et al. |
| 2009/0278209 | A1 | 11/2009 | Noda |
| 2010/0096705 | A1* | 4/2010 | Hung et al. ............ 257/411 |
| 2011/0127618 | A1 | 6/2011 | Scheiper et al. |
| 2011/0269278 | A1 | 11/2011 | Hoentschel et al. |
| 2011/0272766 | A1* | 11/2011 | Hung et al. ............ 257/411 |
| 2012/0043593 | A1* | 2/2012 | Zhong et al. ............ 257/288 |

OTHER PUBLICATIONS

Yan et al., "Method for Forming Integrated Circuit Systems Employing Fluorine Doping", U.S. Appl. No. 13/785,557, filed Mar. 5, 2013.

* cited by examiner

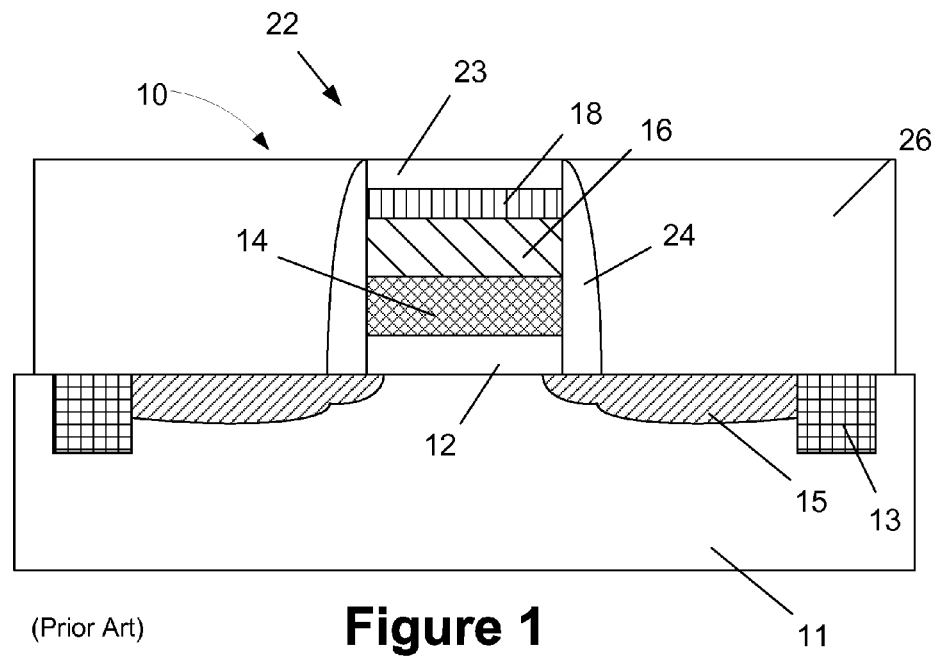
(Prior Art) Figure 1
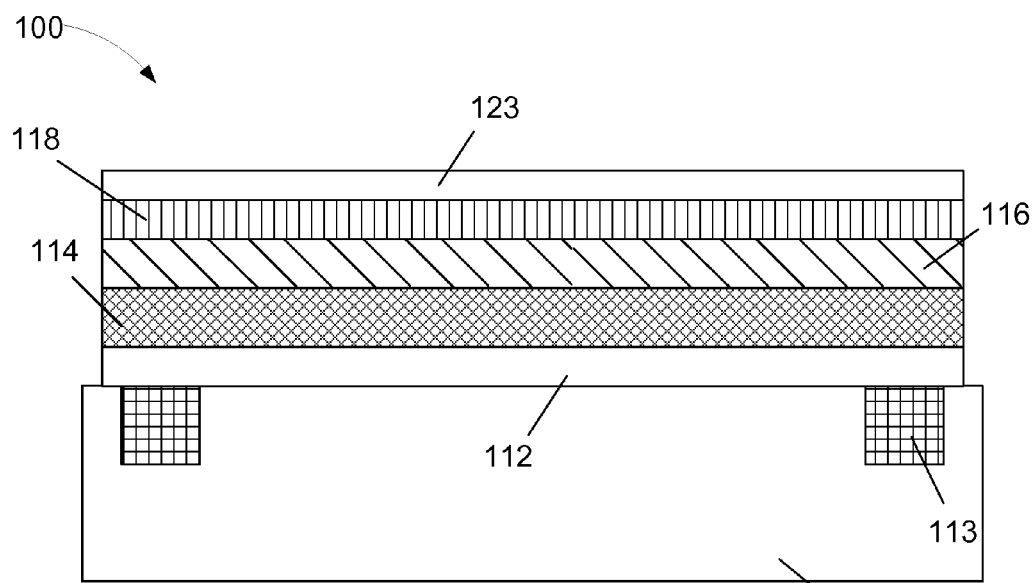
Figure 2A

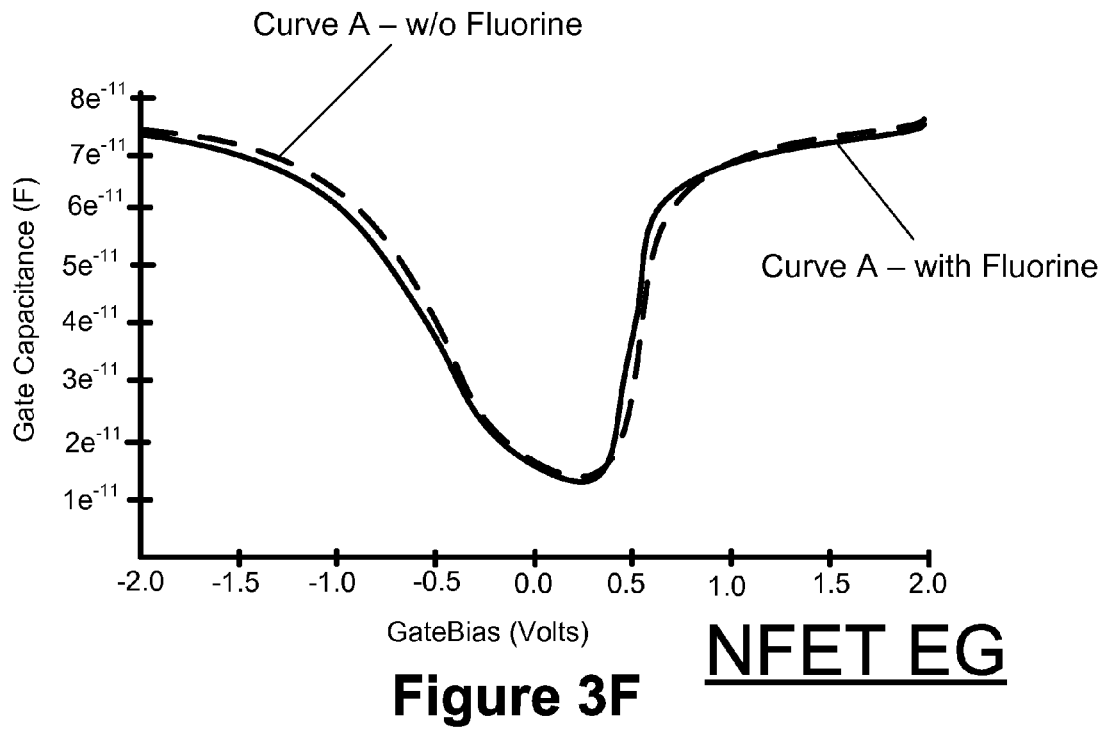
Figure 3F NFET EG
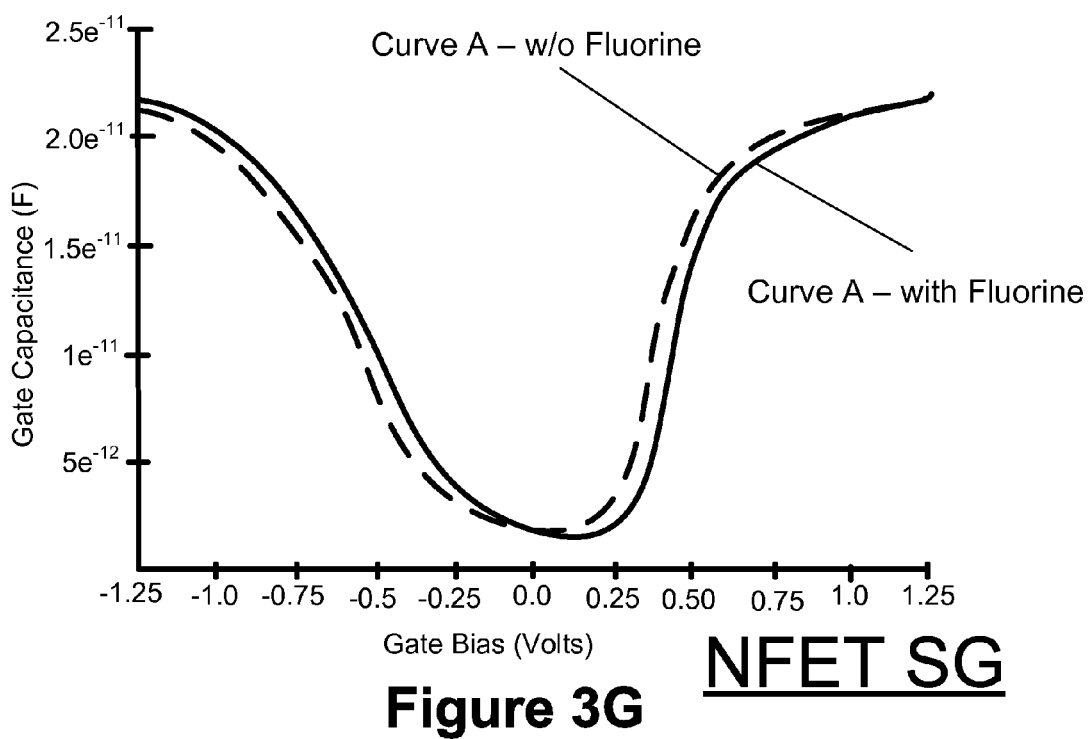
Figure 3G NFET SG

METHODS OF TAILORING WORK FUNCTION OF SEMICONDUCTOR DEVICES WITH HIGH-K/METAL LAYER GATE STRUCTURES BY PERFORMING A FLUORINE IMPLANT PROCESS

BACKGROUND OF THE INVENTION

1. Field of the Invention

Generally, the present disclosure generally relates to the manufacture of sophisticated semiconductor devices, and, more specifically, to various methods of tailoring the work function characteristics of semiconductor devices that have a gate structure comprised of a high-k layer of insulting material and a layer of metal by implanting fluorine into the gate structure.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Metal oxide field effect transistors (MOSFETs or FETs) represent one important type of circuit element that substantially determines performance of the integrated circuits. A FET (whether an NFET or a PFET) is a device that typically includes a source region, a drain region, a channel region that is positioned between the source region and the drain region, and a gate electrode positioned above the channel region. A gate insulation layer is positioned between the gate electrode and the channel region that will be formed in the substrate. Electrical contacts are made to the source and drain regions, and current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region. Traditionally, FETs have been substantially planar devices, but similar principles of operation apply to more three-dimensional FET structures, devices that are typically referred to as FinFETs.

For many early device technology generations, the gate structures of most transistor elements have been comprised of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures comprised of alternative materials in an effort to avoid the short-channel effects which may be associated with the use of traditional silicon-based materials in reduced channel length transistors. For example, in some aggressively scaled transistor elements, which may have channel lengths on the order of approximately 14-32 nm, gate structures having a so-called high-k dielectric/metal gate (HK/MG) configuration have been shown to provide significantly enhanced operational characteristics over the heretofore more commonly used silicon dioxide/polysilicon (SiO/poly) configurations.

Depending on the specific overall device requirements, several different high-k materials—i.e., materials having a dielectric constant, or k-value, of approximately 10 or greater—have been used with varying degrees of success for the gate insulation layer in HK/MG gate structures. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

FIG. 1 depicts one illustrative example of a prior art transistor 10 with a HK/MG gate structure 22. As shown in FIG. 1, the basic transistor structure is formed in and above a semiconducting substrate 11 in an active area defined by a shallow trench isolation structure 13. At the point of fabrication depicted in FIG. 1, the gate structure 22 of the device 10 includes a silicon dioxide gate insulation layer 12 having a thickness of about 1 nm, a layer of hafnium oxide 14 having a thickness of about 1.7 nm, a layer of titanium nitride 16 having a thickness of about 1.5 nm and a work-function adjusting layer of metal 18 having a thickness of about 5 nm. The work-function adjusting layer of metal 18 may be made of a variety of different metals, such as aluminum (Al) for PFET devices or lanthanum (La) for NFET devices. Also depicted in FIG. 1 is an illustrative protective gate cap layer 23 (e.g., silicon nitride), illustrative sidewall spacers 24 (e.g., silicon nitride), a layer of insulating material 26 (e.g., silicon dioxide) and a plurality of source/drain regions 15 that are formed in the substrate 11.

The various components and structures of the device 10 may be formed using a variety of different materials and by performing a variety of known techniques. For example, the source/drain regions 15 may be comprised of implanted dopant materials (N-type dopants for NFET devices and P-type dopant for PFET devices) that are implanted into the substrate using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon germanium that are typically found in high-performance PFET transistors. In some cases, layers of metal other that the titanium nitride layers may be employed in such devices and other high-k insulation materials may be used in the device 10 instead of the depicted the layer of hafnium oxide 14.

The amount by which the threshold voltage of the device 10 may be lowered depends, at least in part, upon the amount of the work function metal, e.g., aluminum or lanthanum, that diffuses to the interface between the layer of silicon dioxide 12 and the layer of high-k insulating material 14. The amount of the work function metal present at the interface also may degrade the charge carrier mobility of the devices.

The present disclosure is directed to various methods of tailoring the work function characteristics of semiconductor devices that have a gate structure comprised of a high-k layer of insulting material and a layer of metal by implanting fluorine into the gate structure that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of tailoring the work function characteristics of semiconductor devices that have a gate structure comprised of a high-k layer of insulting material and a layer of metal by implanting fluorine into the gate structure. One illustrative method disclosed herein includes forming a plurality of layers of material above a semiconducting substrate, wherein the plurality of layers of material will comprise a gate structure for a transistor, performing a fluorine ion implantation process to implant fluorine ions into at least one of the plurality of layers of material, performing at least one ion implantation process to implant one of a P-type dopant material or an N-type dopant material into the substrate to form source/drain regions for the transistor, and performing an anneal process after the fluorine ion implant process and the at least one ion implant process have been performed.

One illustrative method disclosed herein includes forming a plurality of layers of material above a semiconducting substrate, wherein the plurality of layers of material will comprise a gate structure for a transistor and wherein the plurality of layers of material comprise a gate insulation layer formed on the substrate, a layer of high-k insulating material formed on the gate insulation layer and a layer of metal formed on the layer of high-k insulating material, performing a fluorine ion implantation process to form an as-implanted fluorine implant region that is positioned at least partially in the layer of high-k insulating material, performing at least one ion implantation process to implant one of a P-type dopant material or an N-type dopant material into the substrate to form source/drain regions for the transistor, and performing an anneal process after the fluorine ion implant process and the at least one ion implant process have been performed.

BRIEF DESCRIPTION OF THE DRAWINGS

The disclosure may be understood by reference to the following description taken in conjunction with the accompanying drawings, in which like reference numerals identify like elements, and in which:

FIG. 1 depicts an illustrative prior art transistor device with an illustrative high-k/metal gate structure;

FIGS. 2A-2K depict various illustrative methods disclosed herein for tailoring the work function characteristics of semiconductor devices by implanting fluorine into the gate structure of such devices; and FIGS. 3A-3H depict various test data and simulation results for various devices made using one or more of the methods described herein.

Figure 2B:
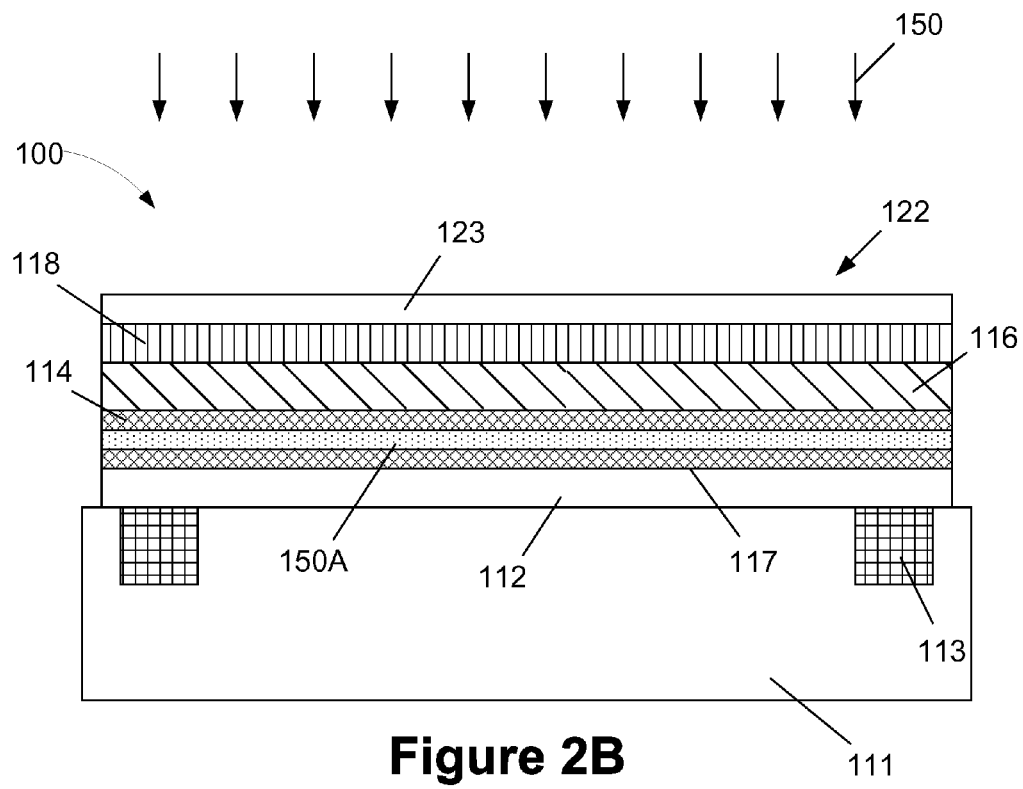

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of tailoring the work function characteristics of semiconductor devices that have a gate structure comprised of a high-k layer of insulting material and a layer of metal by implanting fluorine into the gate structure. As will be readily apparent to those skilled in the art upon a complete reading of the present application, the presently disclosed methods and devices may be applied to a variety of different technologies, e.g., NFET, PFET, CMOS, etc., and they may be readily employed with a variety of integrated circuit devices, including, but not limited to, logic devices, memory devices, etc. With reference to the attached figures, various illustrative embodiments of the devices disclosed herein will now be described in more detail.

In general, the present invention involves, among other things, implanting fluorine into a gate structure of a semiconductor device, such as a transistor. The implant process may be performed at virtually any time during the fabrication of the device. For example, the fluorine implant process may be performed before or after gate patterning operations are performed or before or after performing the implant processes to device extension implant regions or deep source/drain implant regions. Thus, in their broadest sense, the presently disclosed inventions should not be considered as being limited to performing the fluorine implantation process at any particular point in the process flow.

FIG. 2A depicts one illustrative embodiment of a transistor 100 at an early stage of manufacture. The transistor 100 will be formed in and above a semiconducting substrate 111 in an active area defined by a shallow trench isolation structure 113. The substrate 111 may have a variety of configurations, such as the depicted bulk silicon configuration. The substrate 111 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 111 may also be made of materials other than silicon.

At the point of fabrication depicted in FIG. 2A, various layers of material that will ultimately become part of the gate structure for the device are formed above the substrate 111. In the depicted example, the various layers includes a gate insulation layer 112, e.g., silicon dioxide (about 1 nm in thickness), a layer of a high-k insulating material 114 (k value of 10 or greater), e.g., hafnium oxide or any of the other illustrative high-k materials described in the background section of this application, a layer of titanium nitride 116, a layer of polysilicon 118 and a gate cap layer 123, e.g., silicon nitride. If desired, a work-function adjusting layer of metal (not shown) may also be included in the stack of materials, and such a work-function adjusting layer may be made of a variety of different metals, such as aluminum (Al) for PFET devices or lanthanum (La) for NFET devices, and its thickness may vary depending upon the particular application. The various layers of material shown in FIG. 2A may be formed by performing a variety of process operations that are well known to those skilled in the art, e.g., a thermal growth process, an atomic layer deposition (ALD) process, a chemical vapor deposition (CVD) process, a physical vapor deposition (PVD) process, or plasma enhanced versions of such processes. Of course, the various material layers depicted in FIG. 2A are illustrative in nature as the method described herein may be employed when forming semiconductor devices with virtually any type of a high-k/metal gate configuration. In some cases, the gate structures for the device may have more than one layer of metal and/or more than one layer of high-k material.

In one example disclosed herein, as shown in FIG. 2B, the fluorine ion implant process 150 is performed prior to performing gate patterning operations. The fluorine implant process 150 results in the formation of an as-implanted fluorine implant region 150A. In the depicted example, the fluorine implant process 150 is performed with an energy level that is sufficient to cause the midpoint concentration level of the as-implanted fluorine implant region 150A to be positioned approximately mid-thickness of the layer of high-k insulating materials 114. In one illustrative example, the fluorine implant process 150 was performed using a fluorine dose of about $1e^{15}$ atoms/cm$^2$ and at an energy level of about 10 keV. Thus, in this example, the lower boundary of the as-implanted fluorine implant region 150A is positioned above the interface 117 between the gate insulation layer 112 and the high-k insulating material 114. However, it is not required that the entire as-implanted fluorine implant region 150A be positioned entirely within the high-k insulating material 114, as depicted in FIG. 2A. Rather, in a real-world device, the position of the as-implanted fluorine implant region 150A may span multiple layers of material within the gate structure 122 and even penetrate into the substrate 111 to some degree. This is also true for the location of the implanted fluorine ions after they migrate due to an anneal process (as described more fully below).

Figure 2C:
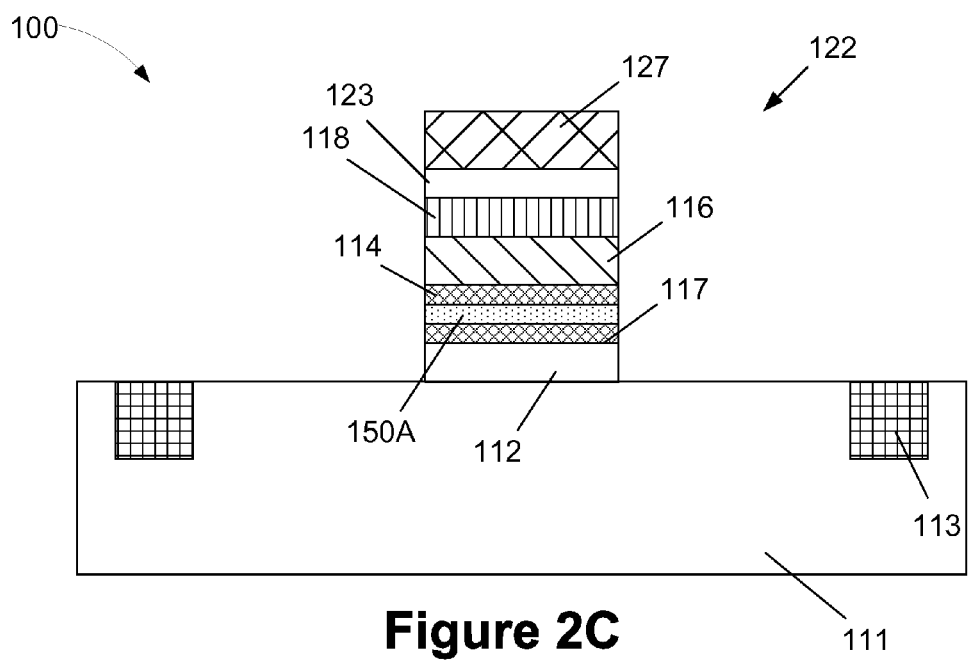

FIG. 2C depicts the device 100 after gate patterning operations have been performed on the various layers of material shown in FIG. 2B to thereby define the basic gate structure 122 for the device 100. More specifically, using traditional techniques, a patterned etch mask 127, e.g., a patterned photoresist mask, is formed above the cap layer 123. Thereafter, one or more etching processes, such as reactive ion etching processes, are performed through the patterned mask layer to thereby result in the gate structure 122 depicted in FIG. 2C.

Figure 2D:
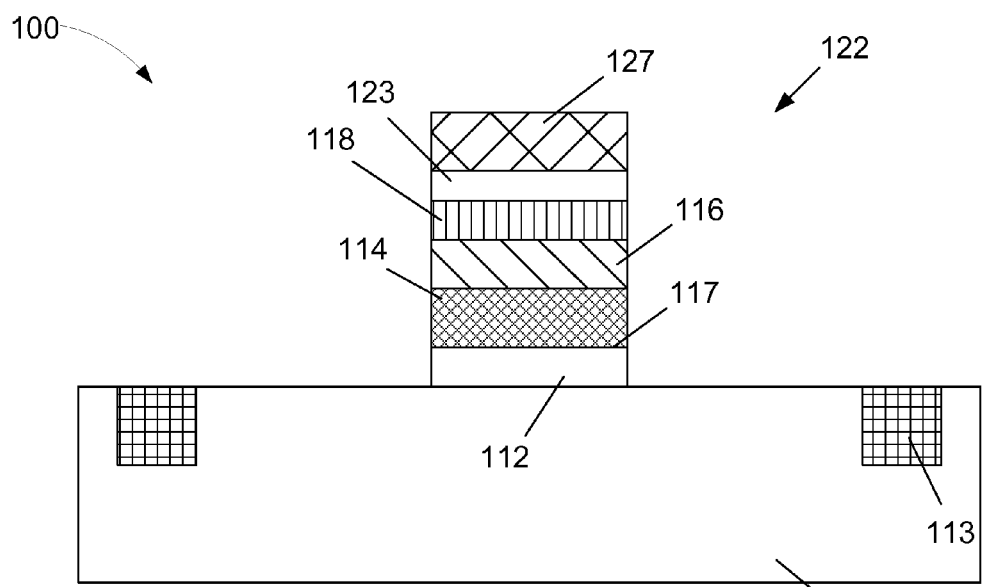
Figure 2E:
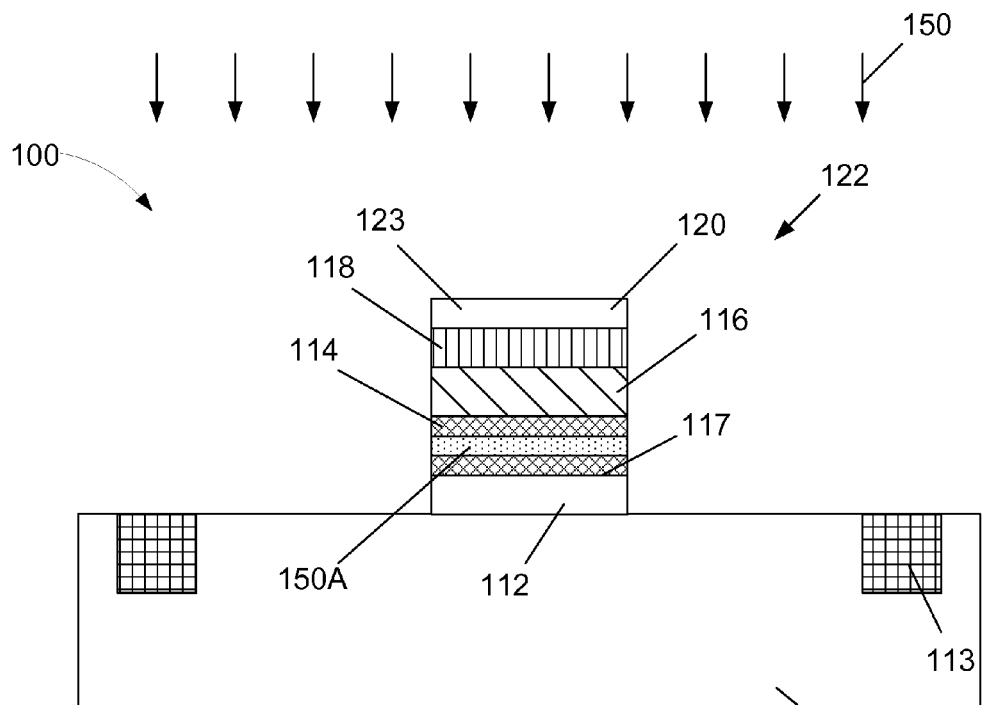

FIGS. 2D-2E depict the illustrative example described herein where the fluorine implantation process 150 is performed after basic gate patterning operations have been performed. More specifically, as shown in FIG. 2D, using traditional techniques, a patterned etch mask 127, e.g., a patterned photoresist mask, is formed above the cap layer 123. Thereafter, one or more etching processes, such as reactive ion etching processes, are performed through the patterned mask layer 127 to thereby result in the basic gate structure 122 depicted in FIG. 2D. Thereafter, as shown in FIG. 2E, the previously-described fluorine ion implant process 150 is performed on the patterned gate structure 122 to form the fluorine implant region 150A in the layer of high-k insulating material 114. The parameters for the fluorine implant process 150 may be the same for all of the fluorine implant processes described herein.

Figure 2F:
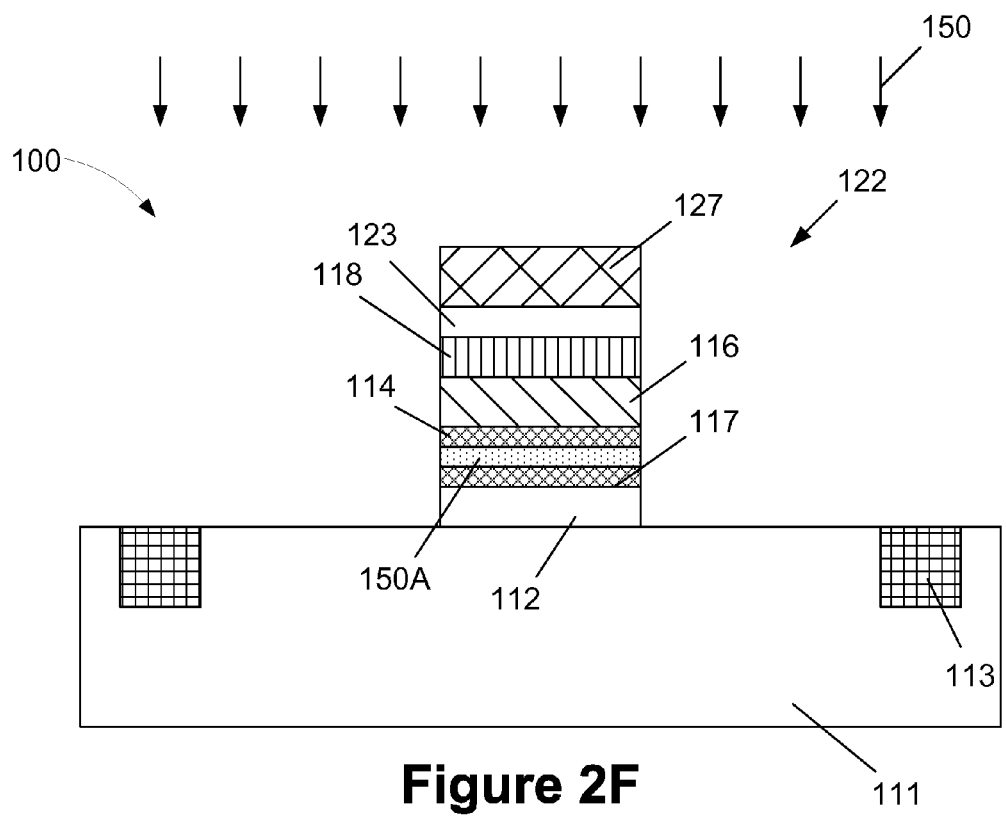
Figure 2G:
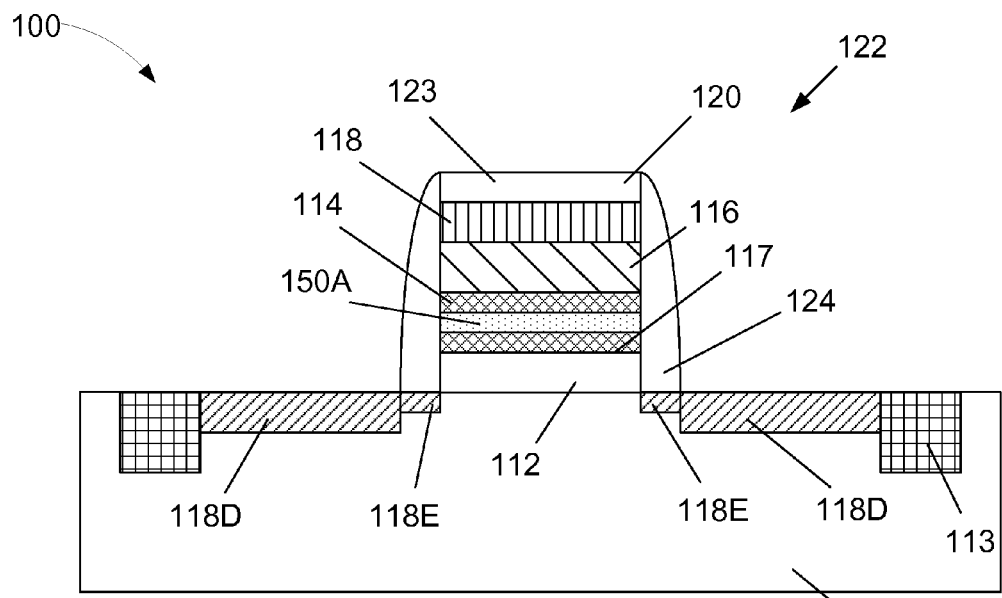
Figure 2H:
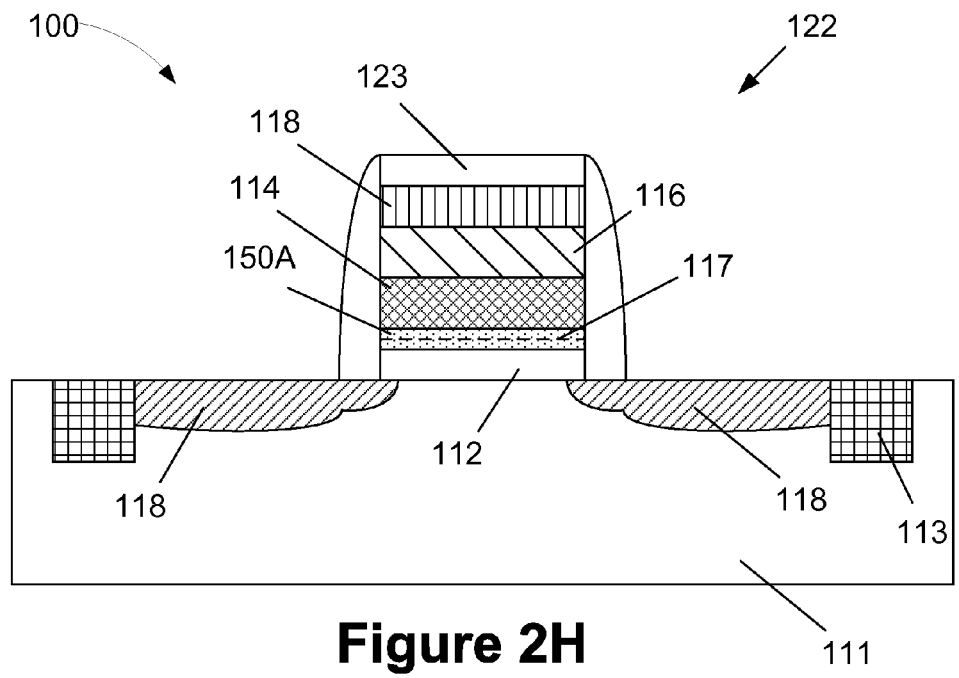

FIGS. 2F-2H depict one illustrative method disclosed herein where the fluorine implantation process 150 is performed prior to performing the ion implantation processes that will be performed to form extension implant regions and deep source/drain implant regions in the substrate 111. The fluorine implant region 150A depicted in FIG. 2F may be formed by either of the techniques previously described, i.e., by performing the fluorine implant process 150 prior to performing gate patterning operations (see FIGS. 2A-2C) or by performing the fluorine implant process 150 after gate patterning operations have been performed (see FIGS. 2D-2E).

FIG. 2G depicts the device after several process operations have been performed. More specifically, an initial ion implantation process is typically performed to form so-called extension implant regions 118E in the substrate 111. The masking layer that would be used during the implantation process is not depicted in the drawings. The extension implant process is typically self-aligned with respect to the sidewall of the gate structure 122. However, in some applications, a small liner of thin sidewall spacer (not shown) may be formed on the gate structure 122 prior to performing the extension implant process. Then, sidewall spacers 124 are formed proximate the gate structure 122. The spacers 124 are typically formed by conformably depositing a layer of spacer material, e.g., silicon nitride, and thereafter performing an anisotropic etching process. Then, a second ion implantation process is performed on the device 100 to form so-called deep source/drain implant regions 118D in the substrate 111. The ion implantation process performed to form the deep source/drain implant regions 118D is typically performed using a higher dopant dose and it is performed at a higher implant energy than the ion implantation process that was performed to form the extension implant regions 118E. The deep source/drain implant process is typically self-aligned relative to the sidewall spacers 124. Of course, the type of dopants implanted, either N-type or P-type dopants, depends upon the type of transistor being made, i.e., an NFET device or a PFET device, respectively.

Thereafter, as shown in FIG. 2H, a heating or anneal process is performed to form the final source drain regions 118 for the device 100. This heating process repairs the damage to the lattice structure of the substrate material as a result of the various ion implantation processes and it activates the implanted dopant materials, i.e., the implanted dopant materials are incorporated into the silicon lattice. The temperature and duration of the heating or anneal process may vary depending on the particular application. In one illustrative example, the anneal process may be performed at a temperature of about 1000-1070° C. for a duration of about 1-20 seconds. During this heating or anneal process, the implanted dopant material for the source/drain regions 118 moves or migrates to the final desired position of the dopant material, as depicted in FIG. 2H. The anneal process also causes the implanted fluorine atoms in the as-implanted fluorine implant region 150A to move from their as-implanted position shown in FIG. 2G, i.e., about mid-thickness of the high-k layer of insulating material 114, to the final position shown in FIG. 2H. In this final position, some of the implanted fluorine atoms have migrated past the interface 117 (shown in dashed lines in FIG. 2H) and into the gate insulation layer 112 to a position that is closer to the surface of the substrate 111.

Figure 2I:
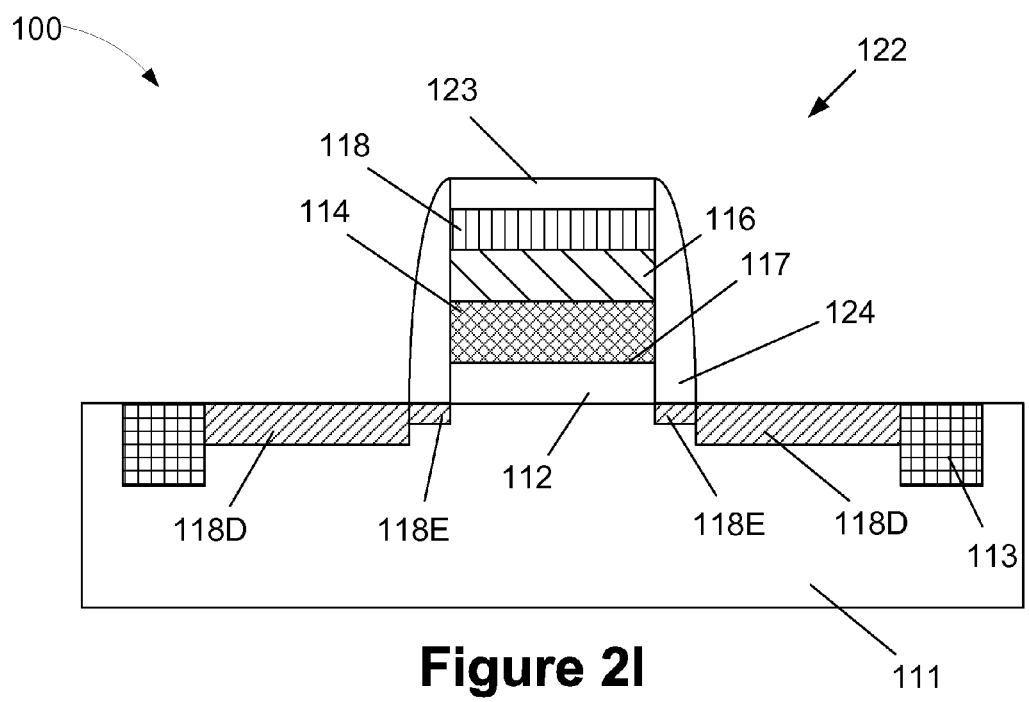
Figure 2J:
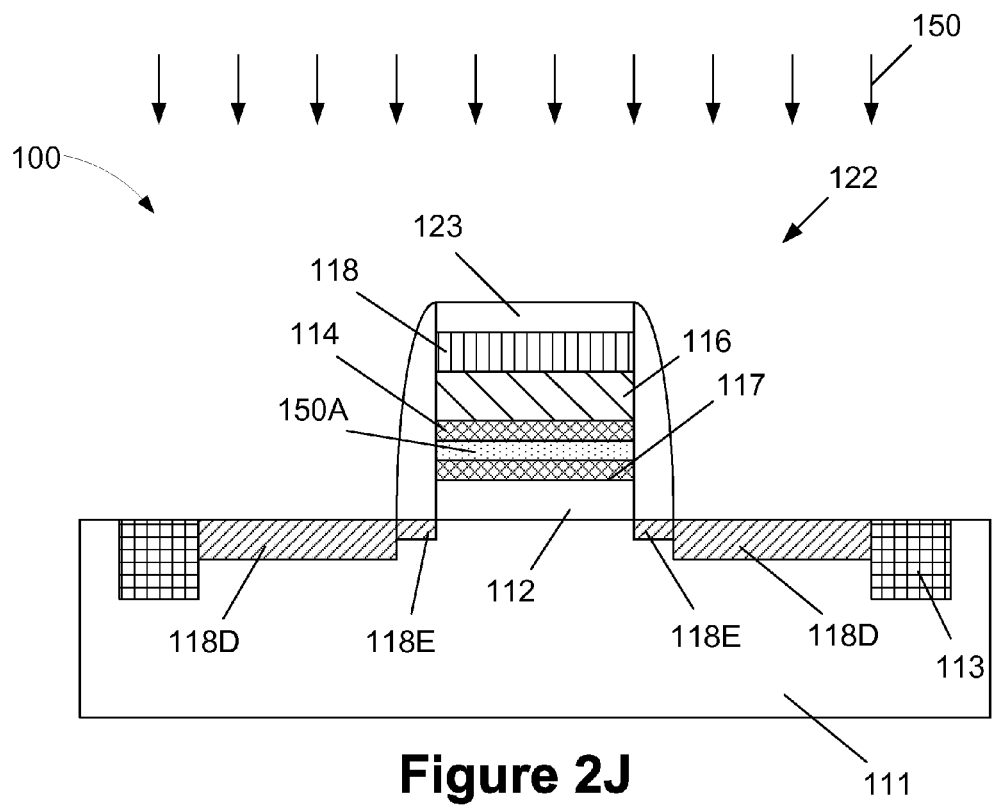
Figure 2K:
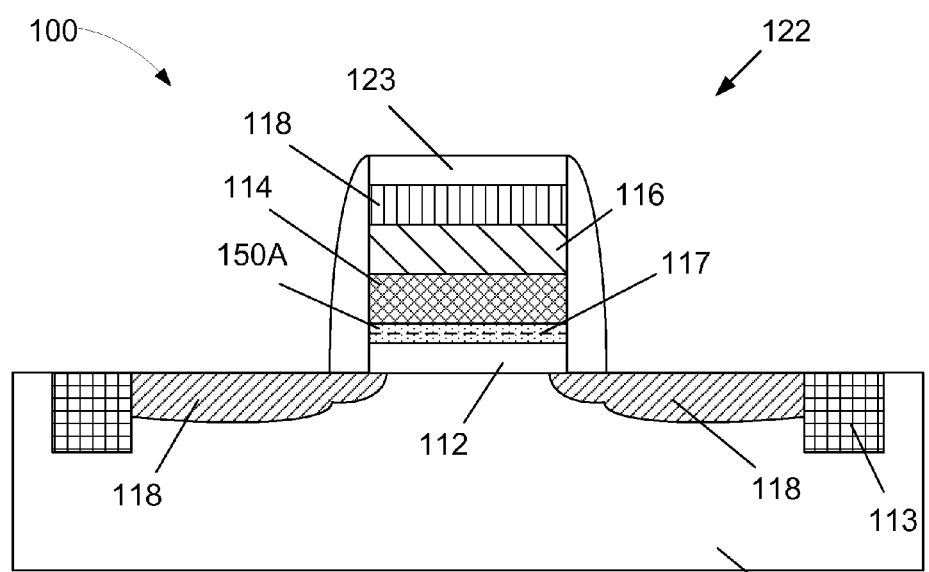

FIGS. 2I-2K depict one illustrative method disclosed herein where the fluorine implantation process 150 is performed after performing the previously described extension and deep source/drain ion implantation processes. FIG. 2I depicts the device after several process operations have been performed. More specifically, an initial ion implantation process has been performed to form the depicted extension implant regions 118E in the substrate 111. Then, sidewall spacers 124 are formed proximate the gate structure 122. The spacers 124 are typically formed by conformably depositing a layer of spacer material, e.g., silicon nitride, and thereafter performing an anisotropic etching process. Then, a second ion implantation process is performed on the device 100 to form the depicted deep source/drain implant regions 118D in the substrate 111. The implant regions 118E/118D are depicted in their as-implanted position in FIG. 2I.

In this example, as shown in FIG. 2J, the fluorine implant process 150 is performed to form the as-implanted fluorine implant region 150A in the layer of high-k insulating material 114. Thereafter, as shown in FIG. 2K, the previously described heating or anneal process is performed to form the final source drain regions 118 for the device 100 and to cause the implanted fluorine atoms to migrate to their final desired position, as previously discussed. At this point of fabrication (as well as that depicted in FIG. 2H), additional processing operations may be performed to complete the fabrication of the device 100. Of course, those skilled in the art will recognize that there are other features of the transistor 100 that are not depicted in the drawings for purposes of clarity. For example, so-called halo implant regions are not depicted in the drawings, as well as various layers or regions of silicon/germanium that are typically found in high-performance PFET transistors.

FIGS. 3A-3H depict various test data and simulation results for various devices made using one or more of the methods described herein, wherein various metals were employed as the gate electrode structure positioned above a layer of hafnium oxide (the high-k insulating material 114) having a thickness of about 1.5-3 nm and a layer of silicon dioxide (the gate insulation layer 112) having a thickness of about 0.7-1.5 nm. Various testing was performed on various types of devices and simulation models were run in some situations to compare the effectiveness of the methods disclosed herein and to observe various benefits obtained by using the methods disclosed herein. In general, testing was performed on three types of devices: low voltage transistors (LVT—operating voltage of about 200 mV); high voltage transistors (HVT—operating voltage of about 450 mV) and intermittent gate (EG devices—operating voltage of about 400 mV). The testing data and simulation results indicate that the methods disclosed herein are effective for tuning the threshold voltage of a variety of different types of devices.

FIGS. 3A-3E are plots that reflect comparative data from testing of two devices (1NF and 2NF) that were not subjected to the fluorine implant step 150 and one device (AF) that was subjected to the fluorine implant process 150. In all cases, the fluorine implant process 150 was performed after the basic gate structure was patterned and it was also performed prior to performing the source/drain implant processes. Additionally, an anneal process at a temperature of about 1060° C. was performed on the devices for a duration of about 5 seconds.

The vertical axis in FIGS. 3A-3E is the threshold voltage of the various devices in volts. The horizontal axis is a collection of data for each of the three devices—two devices (1NF, 2NF) that were not treated with the fluorine implant process 150 and one device (AF) that was subjected to the fluorine implant process 150. For each of the devices, there was, of course, a range of data, as reflected by the upper and lower bands 300A, 300B shown in FIG. 3A, as well as a collection of data within the box 301 which reflects the middle 50% of the testing data, where the upper boundary of the box 301 represents the 75$^{th}$ percentile of the data set while the lower boundary of the box 301 represents the 25$^{th}$ percentile of the data set. In short, the data within the box 301 represents what is known as the "inter-quartile range" which provides a useful indication of the "spread" of the middle 50% of the data. The middle 50% of the data is useful for interpretation purposes because the middle 50% of the data is not affected by outliers or extreme values, and it typically gives a less biased visualization of the data spread.

Figure 3A:
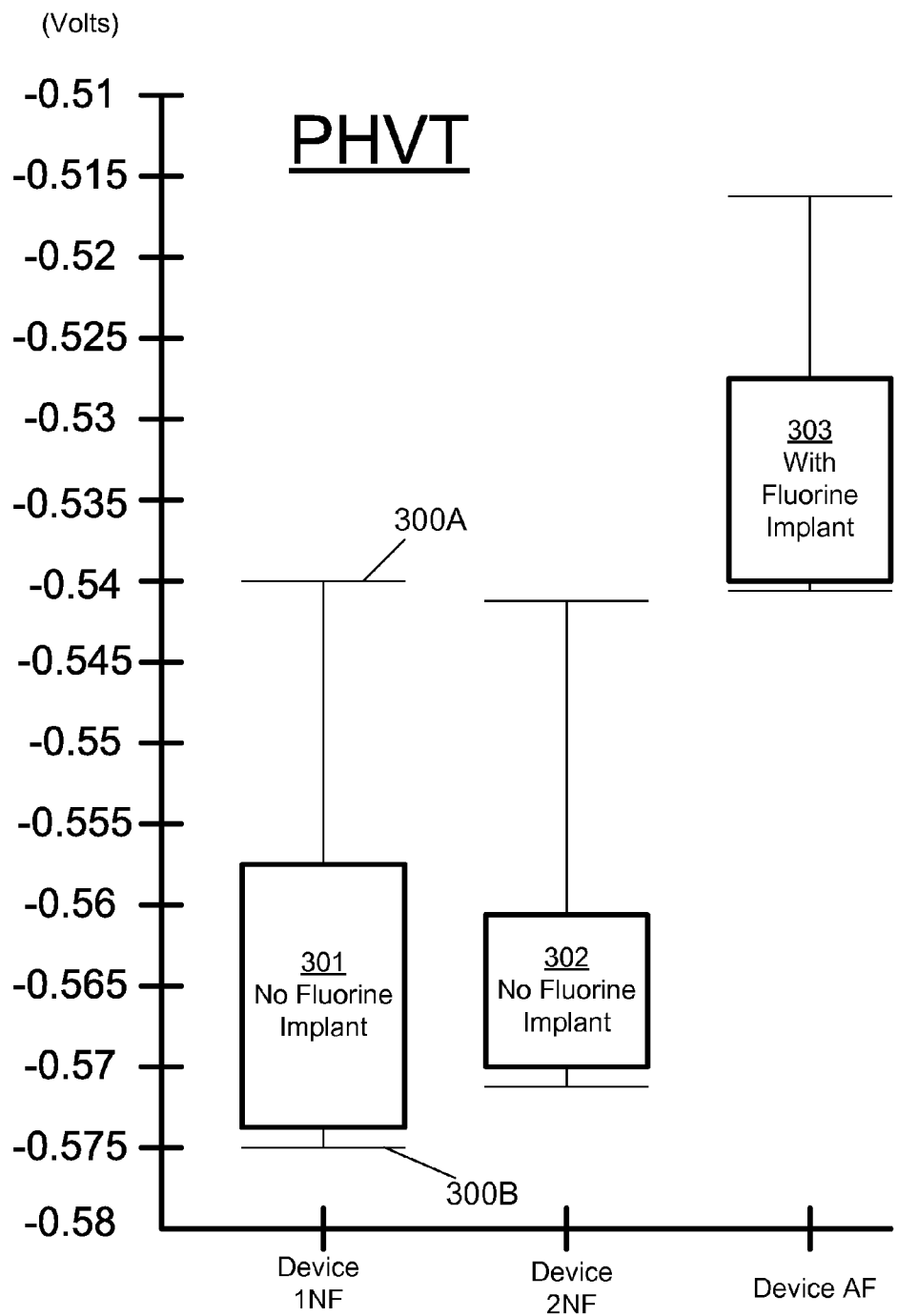

FIG. 3A depicts the testing data associated with high voltage PFET devices (PHVT). As shown therein, see box 303, the threshold voltage of the device (AF) that was exposed to the fluorine implant process 150 was decreased relative to the threshold voltage for the two devices 1NF and 2NF, see boxes 301 and 302, respectively, that were not exposed to the fluorine implant process 150. Looking at approximate average values, the two devices 1NF and 2NF had an average threshold voltage of about –0.565 volts, while the device AF that was exposed to the fluorine implant process 150 had an average threshold voltage of about 0.535 volts. Thus, the fluorine implant process 150 caused the threshold voltage of the AF device to decrease by about 0.030 volts (or about 30 mV)—a significant and important decrease in the threshold voltage of the device AF as compared to the untreated devices 1NF and 2NF.

Figure 3B:
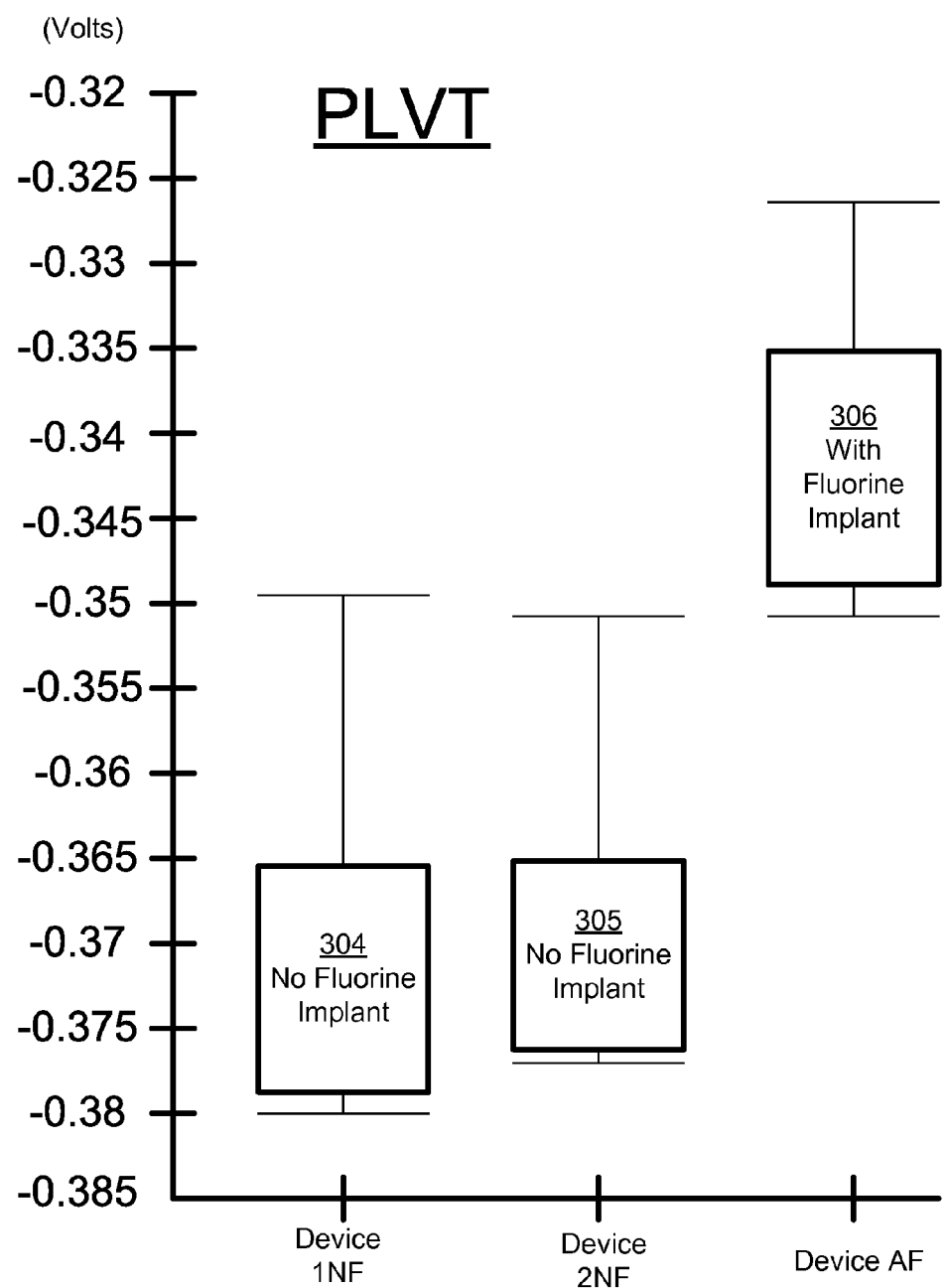

FIG. 3B depicts the testing data associated with low threshold voltage PFET devices (PLVT). As shown therein, see box 306, the threshold voltage of the device (AF) that was exposed to the fluorine implant process 150 was decreased relative to the threshold voltage for the two devices 1NF and 2NF, see boxes 304 and 305, respectively, that were not exposed to the fluorine implant process 150. More specifically, the threshold voltage for the PFET device AF in FIG. 3B was decreased by about 0.030 volts (or about 30 mV)—a significant and important decrease in the threshold voltage—as compared to the untreated devices 1NF and 2NF.

Figure 3C:
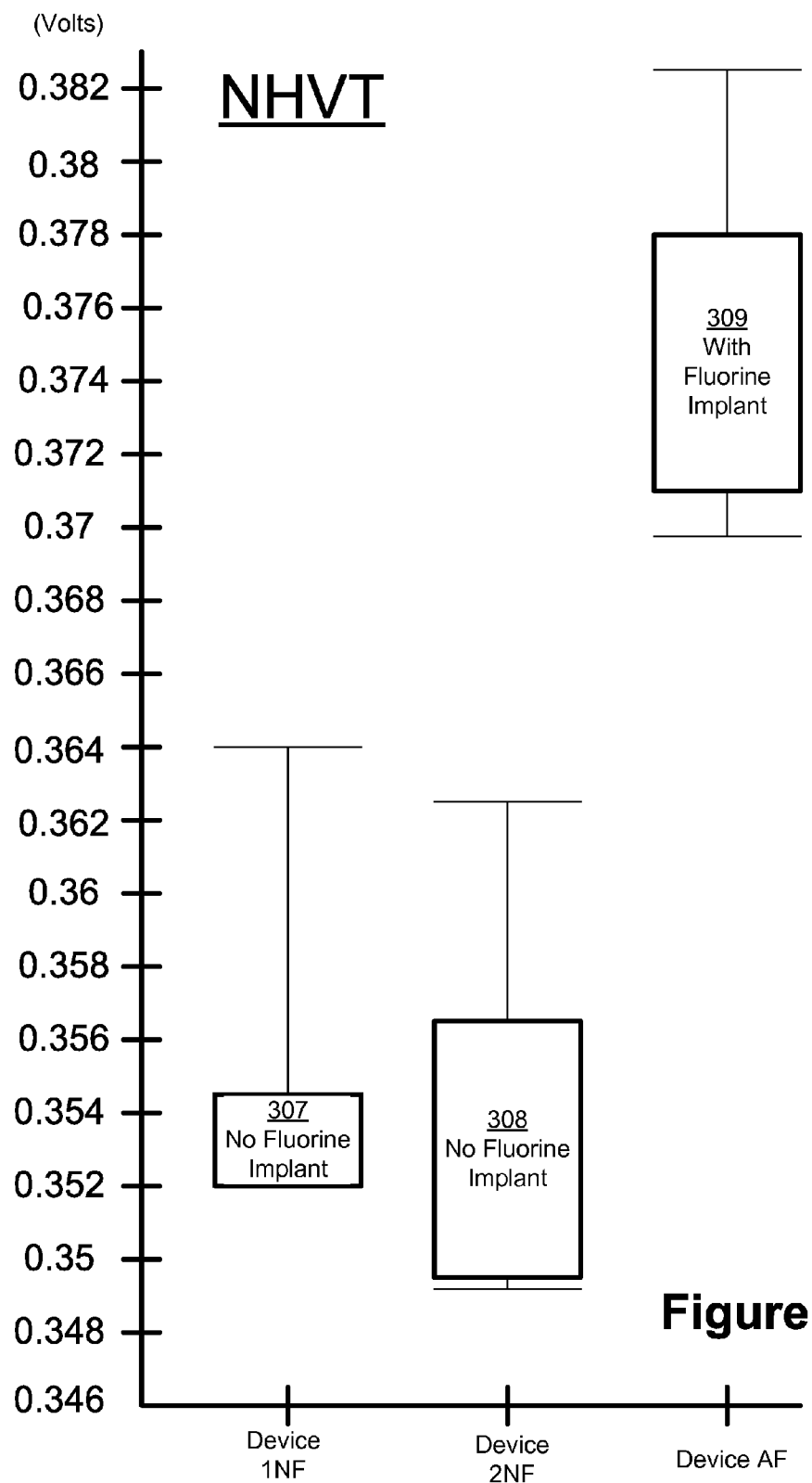

FIG. 3C depicts the testing data associated with high threshold voltage NFET devices (NHVT). As shown therein, see box 309, the threshold voltage of the device (AF) that was exposed to the fluorine implant process 150 was increased relative to the threshold voltage for the two devices 1NF and 2NF, see boxes 307 and 308, respectively, that were not exposed to the fluorine implant process 150. More specifically, the threshold voltage for the NFET device AF in FIG. 3C was increased by about 0.025-0.030 volts (or about 25-30 mV)—a significant and important increase in the threshold voltage—as compared to the untreated devices 1NF and 2NF. The increase in the threshold voltage of the NFET device AF is desirable because it allows device makers to reduce channel doping and it will improve the charge carrier mobility of NFET devices.

Figure 3D:
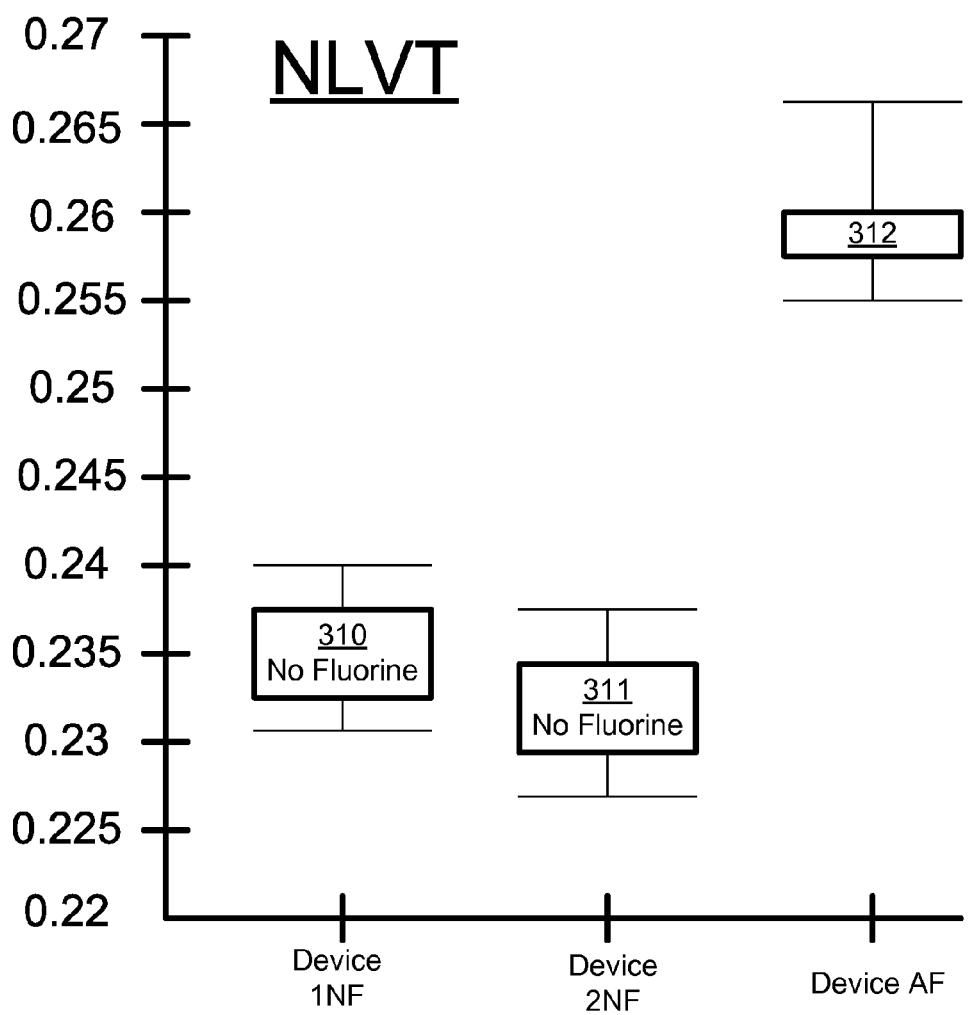

FIG. 3D depicts the testing data associated with low threshold voltage NFET devices (NLVT). As shown therein, see box 312, the threshold voltage of the device (AF) that was exposed to the fluorine implant process 150 was increased relative to the threshold voltage for the two devices 1NF and 2NF, see boxes 310 and 311, respectively, that were not exposed to the fluorine implant process 150. More specifically, the threshold voltage for the NFET device AF in FIG. 3D was increased by about 0.025 volts (or about 25 mV)—a significant and important increase in the threshold voltage—as compared to the untreated devices 1NF and 2NF.

Figure 3E:
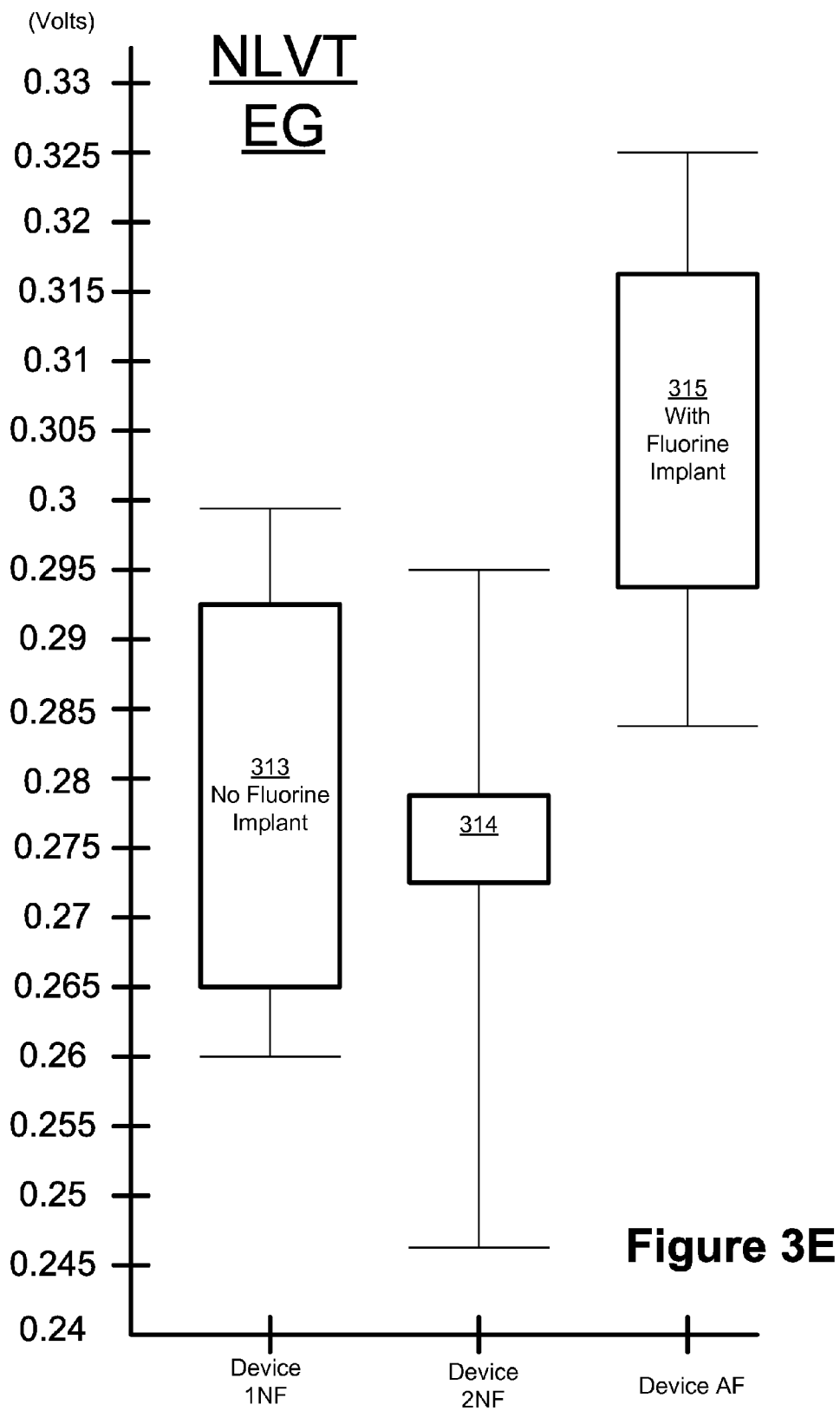

FIG. 3E depicts the testing data associated with low threshold voltage NFET EG devices (NLVT EG). As shown therein, see box 315, the threshold voltage of the device (AF) that was exposed to the fluorine implant process 150 was increased relative to the threshold voltage for the two devices 1NF and 2NF, see boxes 313 and 314, respectively, that were not exposed to the fluorine implant process 150. More specifically, the threshold voltage for the NFET EG device AF in FIG. 3D was increased by about 0.025 volts (or about 25 mV)—a significant and important increase in the threshold voltage—as compared to the untreated devices 1NF and 2NF.

FIGS. 3F-3G depict various test data that demonstrates how the threshold voltages of various devices may be shifted by employing the fluorine implant process described herein. More specifically, FIGS. 3F and 3G reflect test data for an illustrative NFET EG device and a NFET SG device, respectively. The vertical axis in FIGS. 3F-3G is the gate capacitance the various devices in farads, while the horizontal axis is the gate voltage applied to the device in volts. Two curves are presented in FIGS. 3F and 3G. The dashed line (" - - - ") reflects data for a device that was not treated with the fluorine implant process 150, while the solid line reflects data for a device that was subjected to the fluorine implant process 150.

As can be seen in FIG. 3F, there is a right-ward shift or increase in threshold voltage for the illustrative NFET EG device that was subjected to the fluorine implant process 150. Similarly, FIG. 3G also depicts a right-ward shift or increase in the illustrative NFET SG device.

Figure 3H:
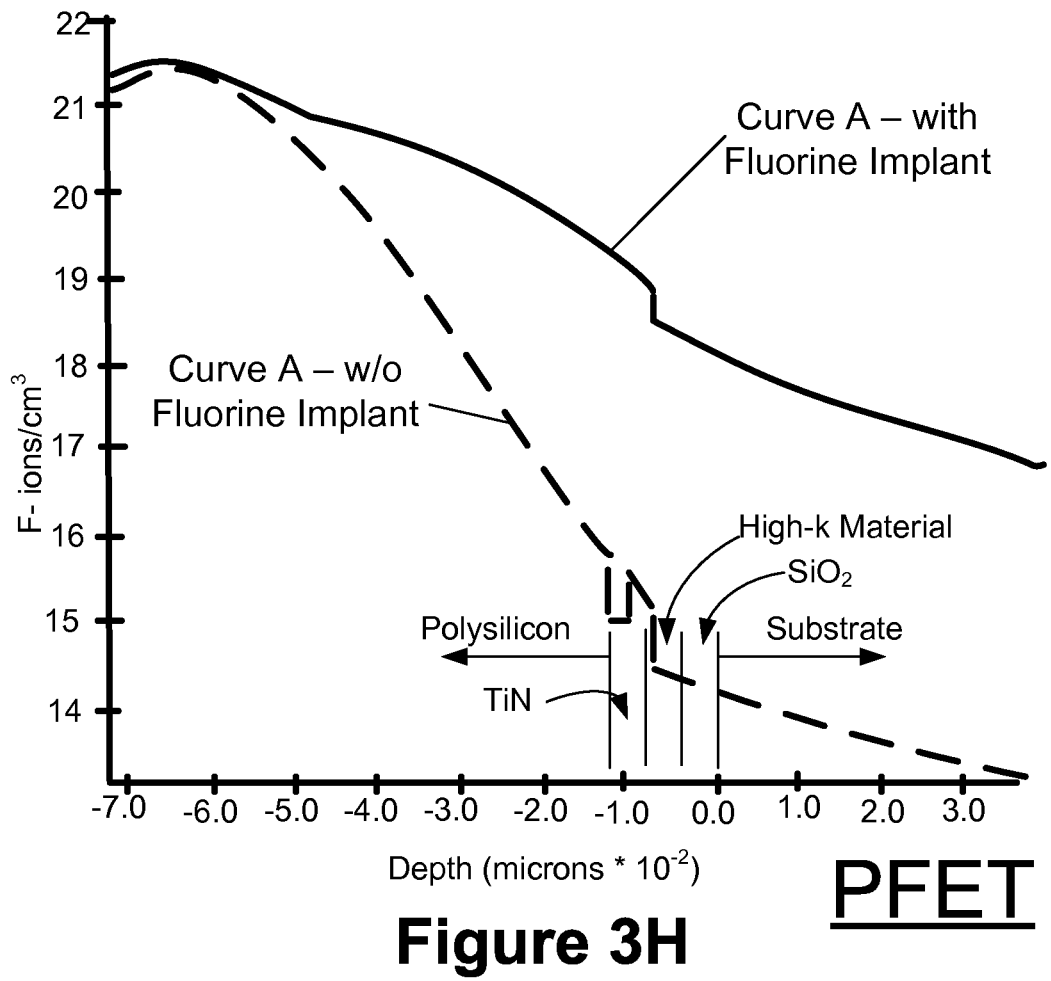

FIG. 3H depicts simulation results that were performed to check the fluorine implant profile in the channel region for illustrative PFET devices (PHVT devices). The vertical axis in FIG. 3H is a log based scale of fluorine concentration in ions/cm$^3$, while the horizontal axis reflects the location or depth within the gate structure 122 or the substrate 111 where the fluorine is present. The simulation was performed based upon the as-implanted location of the fluorine. The point "0.0" is the surface of the substrate 111, and values to the right of the "0.0" point reflect that the fluorine has penetrated into the substrate 111 for at least some degree. Also depicted on FIG. 3H are vertical lines that are located at the boundaries of the various material layers that make up the gate structure 122. As can be seen in FIG. 3H, the layer of silicon dioxide 112 is formed on the surface ("0.0") of the substrate 111, the high-k insulating material 114 is formed on the layer of silicon dioxide 112, the layer of titanium nitride 118 is formed on the high-k insulating material layer 118, and the layer of polysilicon 120 is formed on the layer of titanium nitride 118.

Two curves are presented in FIG. 3H. The dashed line (" - - - ") reflects data for a PFET device that was not treated with the fluorine implant process 150, while the solid line reflects data for a PFET device that was subjected to the fluorine implant process 150. As can be seen in FIG. 3H, the fluorine concentration for the device that was subjected to the fluorine implant process 150 is much higher in the high-k insulting material layer 114. The higher concentration of the fluorine in the high-k insulating material 114 and at or near the interface 117 between the silicon dioxide layer 112 and the high-k insulating material 114 is responsible for the desirable changes in the threshold voltages of the devices as described herein. Note that, in FIG. 3H, fluorine is depicted as being present in the PFET device that was not subjected to the fluorine implant process 150 described herein. The fluorine that is present in the untreated PFET device is present due to the use of boron di-fluoride ($BF_2$) for the dopant species during the doping of the source/drain regions of the PFET device.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a transistor, comprising:
    forming a plurality of layers of material above a semiconducting substrate, wherein at least some of said plurality of layers of material will comprise a gate structure for said transistor, wherein forming the plurality of layers comprises forming a gate insulation layer on the substrate, forming a high-k insulating material layer on the gate insulation layer, forming a layer of metal on the high-k insulating material layer, forming a layer of polysilicon on the layer of metal and forming a gate cap layer on the layer of polysilicon;
    after forming the gate cap layer, performing a fluorine ion implantation process to form an as-implanted fluorine implant region that is positioned entirely within said layer of high-k insulating material;
    performing at least one ion implantation process to implant one of a P-type dopant material or an N-type dopant material into said substrate to form source/drain regions for said transistor; and
    after performing both of said fluorine ion implantation process and said at least one ion implantation process, performing an anneal process.

2. The method of claim 1, wherein said fluorine ion implantation process is performed prior to performing at least one etching process on said plurality of layers of material to define said gate structure.

3. The method of claim 1, wherein said fluorine ion implantation process is performed after performing at least one etching process on said plurality of layers of material to define said gate structure.

4. The method of claim 1, wherein said fluorine ion implantation process is performed prior to performing said at least one ion implantation process.

5. The method of claim 1, wherein said fluorine ion implantation process is performed after performing said at least one ion implantation process.

6. The method of claim 1, wherein said fluorine ion implantation process is performed using a dose of fluorine of about 1e15 ions/cm2 and it is performed using an energy level of about 10 keV.

7. The method of claim 1, wherein said anneal process is performed at a temperature of about 1000-1070° C. for a duration of about 1-20 seconds.

8. The method of claim 1, wherein performing said anneal process causes at least some of said fluorine ions in said as-implanted fluorine implant region to migrate toward said substrate.

9. A method of forming a transistor, comprising:

forming a plurality of layers of material above a semiconducting substrate, wherein at least some of said plurality of layers of material will comprise a gate structure for said transistor and wherein said plurality of layers of material comprise a gate insulation layer formed on said substrate, a layer of high-k insulating material formed on said gate insulation layer, a layer of titanium nitride formed on said layer of high-k insulating material, a layer of polysilicon formed on the layer of titanium nitride and a gate cap layer formed on the layer of polysilicon;

after forming the gate cap layer, performing a fluorine ion implantation process to form an as-implanted fluorine implant region that is positioned entirely within said layer of high-k insulating material;

performing at least one ion implantation process to implant one of a P-type dopant material or an N-type dopant material into said substrate to form source/drain regions for said transistor; and after performing both of said fluorine ion implantation process and said at least one ion implantation process, performing an anneal process.

10. The method of claim 9, wherein said fluorine ion implantation process is performed prior to performing at least one etching process on said plurality of layers of material to define said gate structure.

11. The method of claim 9, wherein said fluorine ion implantation process is performed after performing at least one etching process on said plurality of layers of material to define said gate structure.

12. The method of claim 9, wherein said fluorine ion implantation process is performed prior to performing said at least one ion implantation process.

13. The method of claim 9, wherein said fluorine ion implantation process is performed after performing said at least one ion implantation process.

14. The method of claim 9, wherein said fluorine ion implantation process is performed using a dose of fluorine of about 1e15 ions/cm2 and it is performed using an energy level of about 10 keV.

15. The method of claim 9, wherein said gate insulation material is comprised of silicon dioxide, and wherein said layer of high-k insulating material is comprised of hafnium oxide.

16. The method of claim 9, wherein performing said anneal process causes at least some of said fluorine ions in said as-implanted fluorine implant region to migrate toward said substrate.

* * * * *